(12) United States Patent  
Rountree

(10) Patent No.: US 8,477,526 B2  
(45) Date of Patent: Jul. 2, 2013

(54) LOW NOISE MEMORY ARRAY

(76) Inventor: Robert Newton Rountree, Richardson, TX (US)

(*) Notice: Subject to any disclaimer, the term of this patent is extended or adjusted under 35 U.S.C. 154(b) by 0 days.

(21) Appl. No.: 13/487,225

(22) Filed: Jun. 3, 2012

(65) Prior Publication Data

US 2012/0275217 A1    Nov. 1, 2012

Related U.S. Application Data

(63) Continuation-in-part of application No. 13/457,464, filed on Apr. 26, 2012.

(60) Provisional application No. 61/517,972, filed on Apr. 27, 2011.

(51) Int. Cl.  
*G11C 11/24* (2006.01)

(52) U.S. Cl.  
USPC .......................................... 365/149; 365/205

(58) Field of Classification Search  
USPC .................................. 365/149, 205  
See application file for complete search history.

(56) References Cited

U.S. PATENT DOCUMENTS

| | | | |
|---|---|---|---|
| 5,034,920 A | | 7/1991 | Rountree |
| 5,058,058 A | * | 10/1991 | Yasuda et al. ............. 365/51 |
| 5,396,450 A | * | 3/1995 | Takashima et al. ........ 365/51 |
| 6,134,160 A | * | 10/2000 | Waller et al. .............. 365/200 |
| 6,445,608 B1 | * | 9/2002 | Schwartz et al. .......... 365/145 |
| 6,545,935 B1 | * | 4/2003 | Hsu et al. .............. 365/230.05 |
| 6,826,069 B2 | * | 11/2004 | Kurjanowicz et al. ..... 365/63 |
| 7,133,304 B2 | * | 11/2006 | Madan et al. ............. 365/145 |
| 2003/0048654 A1 | * | 3/2003 | Schwartz et al. .......... 365/145 |
| 2003/0137892 A1 | * | 7/2003 | Arimoto et al. ........ 365/230.03 |
| 2003/0151943 A1 | * | 8/2003 | Sadakata .................. 365/149 |
| 2004/0047197 A1 | * | 3/2004 | Jeon et al. ................ 365/200 |
| 2004/0170075 A1 | * | 9/2004 | Suh ........................... 365/205 |
| 2004/0246763 A1 | * | 12/2004 | Murakuki ................. 365/145 |
| 2007/0081375 A1 | * | 4/2007 | Kawakita et al. ......... 365/63 |
| 2007/0091699 A1 | * | 4/2007 | Thwaite .................... 365/206 |
| 2007/0121414 A1 | * | 5/2007 | Butler .................... 365/230.03 |
| 2008/0151598 A1 | * | 6/2008 | Madan ...................... 365/145 |
| 2009/0279342 A1 | * | 11/2009 | Rodriguez ................. 365/145 |
| 2011/0096584 A1 | * | 4/2011 | Nakaoka et al. .......... 365/63 |
| 2012/0069636 A1 | * | 3/2012 | Pelley et al. .............. 365/154 |
| 2012/0147686 A1 | * | 6/2012 | Takayama et al. ....... 365/203 |

* cited by examiner

*Primary Examiner* — Michael Tran

(57) ABSTRACT

A memory array compatible with dynamic random access memories (DRAM) and static random access memories (SRAM) is disclosed. The memory array includes a first sense amplifier (700) having a first bit line (754) extending in a first direction and a second bit line (752) extending in a second direction parallel to the first bit line. A second sense amplifier (704) has a third bit line (756) adjacent and parallel to the first bit line. The third bit line remains inactive while the first bit line is active.

20 Claims, 10 Drawing Sheets

LOW NOISE MEMORY ARRAY

This application is a continuation-in-part of Nonprovisional application Ser. No. 13/457,464, filed Apr. 26, 2012, which claims the benefit under 35 U.S.C. §119(e) of Provisional Appl. No. 61/517,972, filed Apr. 27, 2011, which is incorporated herein by reference in its entirety.

BACKGROUND OF THE INVENTION

The present embodiments relate to a low noise memory array architecture suitable for Dynamic Random Access Memories (DRAM), Static Random Access Memories (SRAM), and other memory configurations having complementary bit lines.

Generally, array noise includes any signal transitions that would degrade a data signal either before or during amplification. These signal transitions may be on adjacent bit lines, word lines, column select lines, or other relatively nearby signal lines. The signal transitions are often coupled to the data signal through parasitic capacitance due to the close proximity of the interfering signal lines. Array noise problems, therefore, tend to increase with decreasing feature sizes, since the desired data signal decreases while the parasitic capacitance increases.

FIG. 1 is a diagram of a memory array of the prior art showing adjacent bit lines having a folded bit line architecture in a triple twist configuration. The memory array includes sense amplifiers 100, 110, and 120. In the following discussion a signal bit line includes at least part of an active memory cell that is being read or written. A reference bit line has a capacitance that is substantially equal to the signal bit line capacitance and is set to a reference voltage. Signal bit lines of each sense amplifier are depicted as bold lines, and reference bit lines are depicted as normal weight lines. For example, sense amplifier 100 is connected to reference bit line 102 and signal bit line 104. Sense amplifier 110 is connected to reference bit line 112 and signal bit line 114. Sense amplifier 120 is connected to reference bit line 122 and signal bit line 124.

Referring to FIG. 2, there is a cross-sectional view of adjacent bit line conductors as in FIG. 1 showing parasitic capacitors. Here and in the following discussion, parasitic capacitors are not separate discrete components but have non negligible capacitance due to the proximity of adjacent bit line conductors. The diagram shows adjacent bit line conductors 204, 206, and 208. Parasitic fringe capacitor $C_F$ 214 is between adjacent bit lines 204 and 206. Likewise, parasitic fringe capacitor $C_F$ 216 is between adjacent bit lines 206 and 208. There are also upper 200 and lower 202 conductors adjacent the bit lines. Conductor 200 may comprise overlying word lines of other signal lines. Conductor 202 may be a substrate or other signal lines. Parasitic planar capacitor 210 is between conductor 200 and bit line 206 and has a value of $\alpha C_P$, where $\alpha$ is a real number between 0 and 1. Parasitic planar capacitor 212 is between conductor 202 and bit line 206 and has a value $(1-\alpha)C_P$. For the purpose of the following discussion the total parasitic fringe capacitance to each bit line is $2C_F$, and the total parasitic planar capacitance to each bit line is $C_P$ as will be discussed in detail.

Referring now to FIG. 3, there is a diagram of a memory array as in FIG. 1 showing major parasitic fringe capacitors $C_0$ through $C_7$ for a triple twist bit line configuration. Word line 300 selects three memory cells represented by small circles. These memory cells each develop data signals on their respective signal bit lines shown in bold and connected to respective sense amplifiers 100, 110, and 120. Reference bit lines shown in normal line weights are also connected to respective sense amplifiers 100, 110, and 120. For the case where all three memory cells store a 1, there is no charge transfer through parasitic capacitors $C_0$ or $C_6$, because the change of voltage with respect to time (dv/dt) on all signal bit lines is substantially the same. Likewise, there is no charge transfer through parasitic capacitors $C_2$ or $C_4$, because dv/dt on all reference bit lines is substantially the same. However, the signal bit line 302 of sense amplifier 110 couples charge to the reference bit lines of sense amplifiers 100 and 120 through parasitic capacitors $C_3$ and $C_5$, respectively. In a similar manner, the signal bit lines of sense amplifiers 100 and 120 couple charge to the reference bit line 304 of sense amplifier 110 through parasitic capacitors $C_1$ and $C_7$, respectively. The total coupling to the reference bit line 304 of sense amplifier 110, therefore, is the coupling from the signal bit line 302 ($C_F$) plus the coupling through parasitic capacitors $C_1$ and $C_7$ ($C_F/2$), where $C_F$ is the fringe capacitance between two adjacent bit lines for their total length.

FIG. 4 is a schematic diagram showing the capacitive coupling to the reference bit line 304 of sense amplifier 110 (FIG. 3). When word line 300 activates the memory cells of FIG. 3, a voltage V(1) is developed on each signal bit line across planar parasitic capacitor $C_P$ 400. A fraction of this voltage is coupled through parasitic fringe capacitor 402 (1.5 $C_F$). The noise voltage on reference bit line 304, therefore, is equal to $V(1)/(1+2C_P/3C_F)$. This noise voltage (Vn) on reference bit line 304 reduces the difference voltage between signal bit line 302 and reference bit line 304. For example, when $C_P$ is equal to $C_F$, the resulting signal to noise ratio (V(1)Nn) is 1.67. Under worst case conditions, this may require slower sensing by amplifier 110 and may result in read errors. Thus, there is a need for noise reduction in memory arrays.

Referring to FIG. 5, there is a diagram of a memory array having an open architecture in a cross point configuration. Here and in the following discussion a cross point configuration means that a memory cell is placed at every intersection of a word line and bit line. Typically less area is required for a cross point array than for a folded array. According to previous estimates, a memory cell in a folded array may require $8F^2$ as compared to a memory cell in a cross point array that requires $4F^2$ to $6F^2$ of cell area, where F is a minimum feature size. FIG. 5 illustrates major parasitic fringe capacitors $C_F$ for an open architecture in a cross point configuration. Word line 512 selects four memory cells represented by small circles. These memory cells each develop data signals on their respective signal bit lines shown in bold and connected to respective sense amplifiers 500 and 502. Reference bit lines shown in normal line weights are also connected to respective sense amplifiers 500 and 502. For the case where each of memory cells 504 store a 1 and memory cell 510 stores a 0, there is substantial charge transfer through parasitic capacitors $C_F$, due to the change of voltage with respect to time (dv/dt) between signal bit lines. FIG. 6 is a schematic diagram showing the capacitive coupling to the signal bit line of sense amplifier 502 (FIG. 5). When word line 512 activates the memory cells of FIG. 5, a voltage V(1) is developed on signal bit lines of sense amplifiers 500 across planar parasitic capacitor $C_P$ 600. A fraction of this voltage is coupled through parasitic fringe capacitor 602 (2 $C_F$). The noise voltage imparted to the signal bit line 508 of sense amplifier 502, therefore, is equal to $V(1)/(1+C_P/2C_F)$. This noise voltage (Vn) on the signal bit line reduces the difference voltage between the signal bit line and the reference bit line. For example, when $C_P$ is equal to $C_F$, the resulting signal to noise ratio (V(1)Nn) is 1.5. This is worse than the folded architecture of FIG. 3 and may require even slower sensing by amplifier 502. Thus, there is an even greater need for noise reduction in memory arrays having a cross point configuration.

BRIEF SUMMARY OF THE INVENTION

In a preferred embodiment of the present invention, a memory array is formed having a first sense amplifier with a first bit line extending in a first direction and a second bit line extending in a second direction parallel to the first bit line. A second sense amplifier has a third bit line adjacent and parallel to the first bit line. The third bit line remains inactive while the first bit line is active.

DETAILED DESCRIPTION OF THE INVENTION

The preferred embodiments of the present invention provide significant advantages over memory arrays of the prior art as will become evident from the following detailed description.

Figure 1:
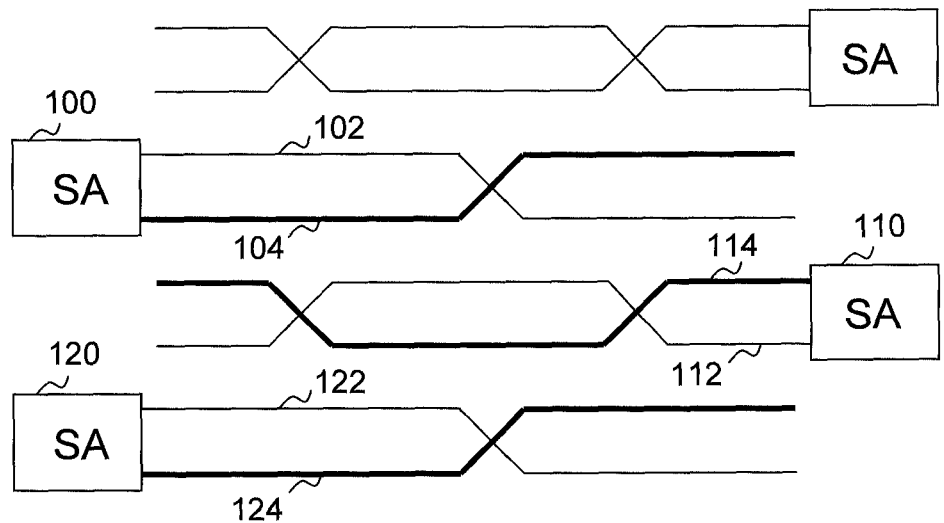
FIG. 1 is a diagram of a memory array of the prior art having a triple twist bit line configuration.
Figure 2:
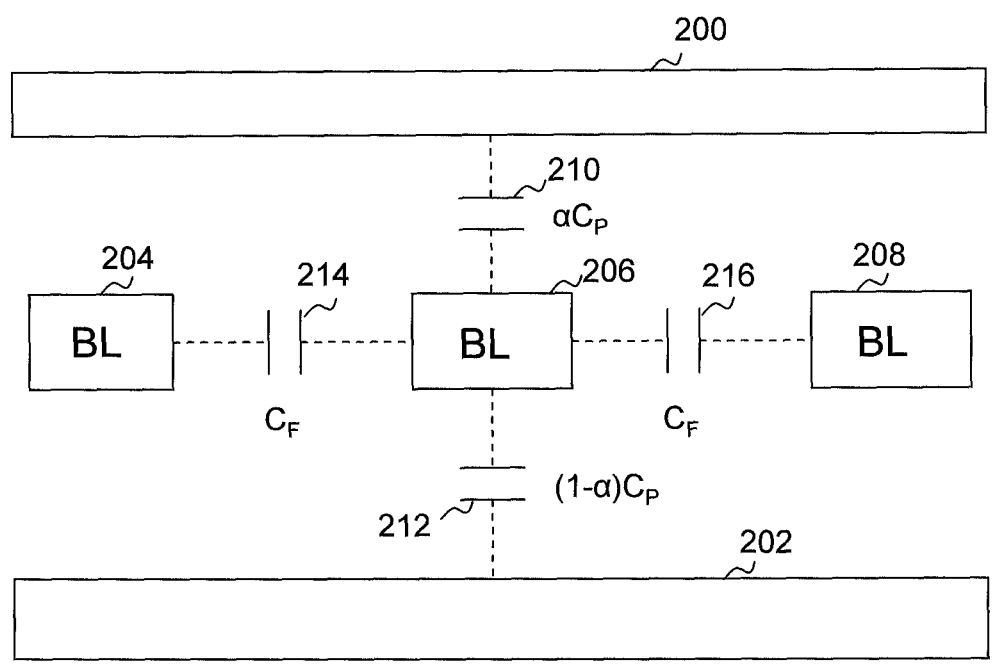
FIG. 2 is a diagram of parasitic capacitance components of a bit line (BL)
Figure 3:
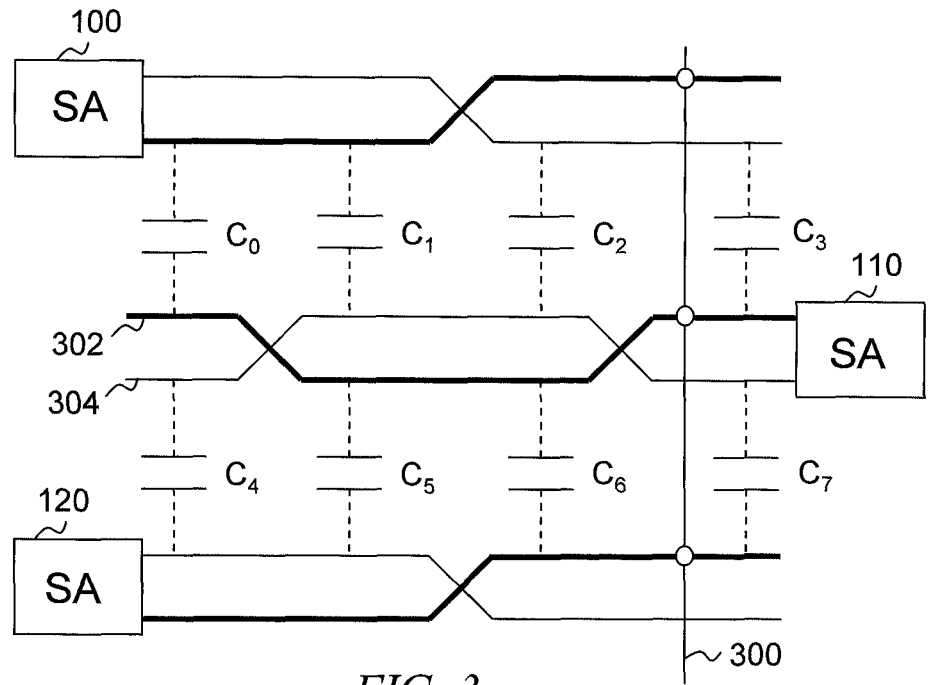
FIG. 3 is a diagram showing parasitic fringe capacitance components for the memory array of FIG. 1.
Figure 4:
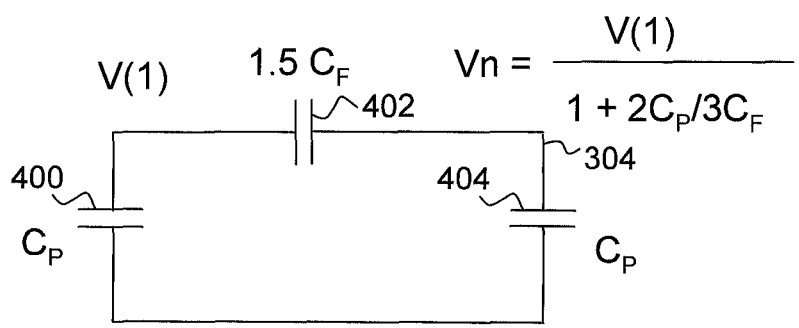
FIG. 4 is a schematic diagram showing noise voltage coupled to a reference bit line due to fringe capacitance.
Figure 5:
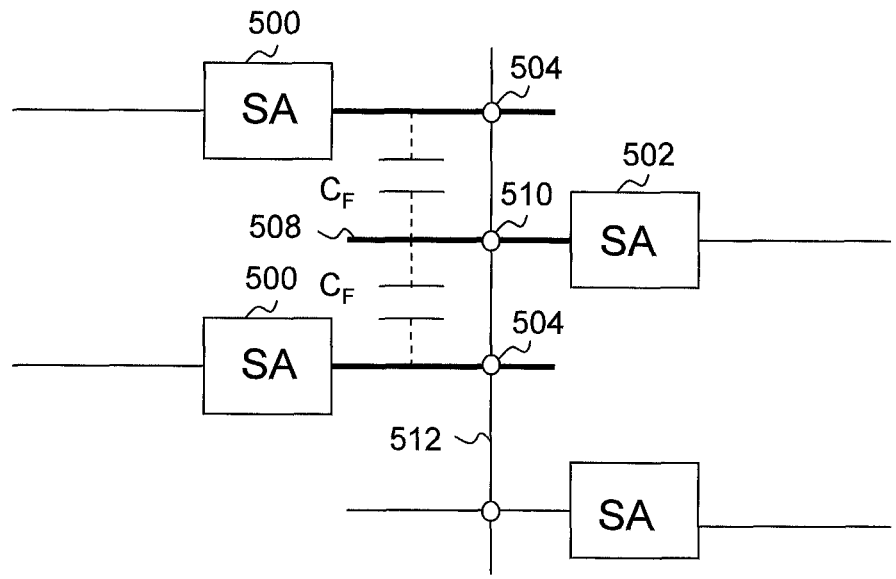
FIG. 5 is a diagram of a memory array of the prior art having a cross point configuration and showing parasitic fringe capacitance components.
Figure 6:
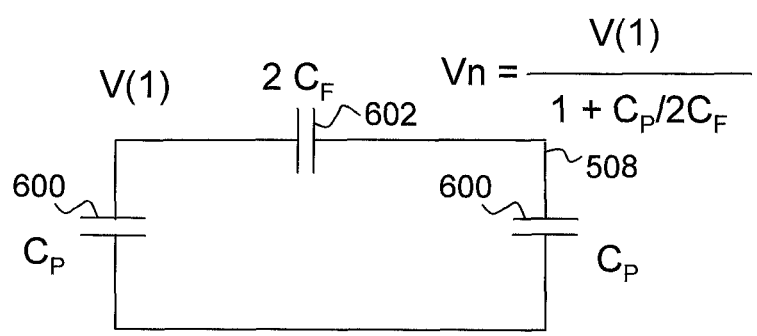
FIG. 6 is a schematic diagram showing noise voltage coupled to a signal bit line due to fringe capacitance.
Figure 7A:
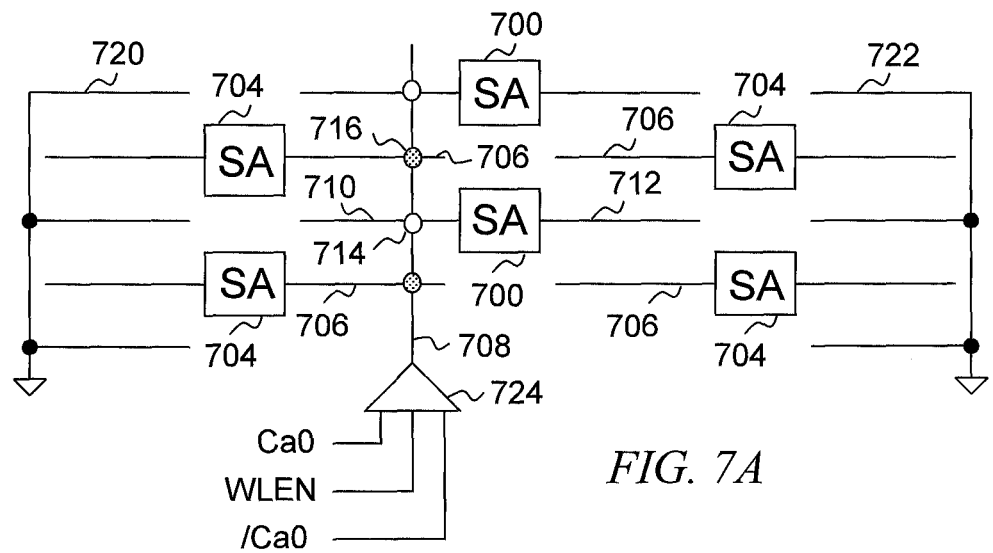
FIG. 7A is a diagram of an embodiment of a memory array of the present invention.

Referring to FIG. 7A, there is an embodiment of a memory array of the present invention. The memory array includes sense amplifiers 700 and 704. Each sense amplifier includes a respective pair of bit lines. Each bit line includes a plurality of memory cells such as memory cells 714 and 716. Memory cells 714 are coupled to respective bit lines by n-channel transistors. Correspondingly, memory cells 716 are coupled to respective bit lines by p-channel transistors. A word line, such as word line 708, selects a row of memory cells during a read operation. Word line 708 is driven by word line drive circuit 724 and will go positive (+Vp) in response to high levels of word line enable signal WLEN and column address signal Ca0. Alternatively, word line 708 will go negative (−Vp) in response to high levels of word line enable signal WLEN and complementary column address signal /Ca0. Thus, a positive level (+Vp) of word line 708 will select memory cells such as memory cell 714 while memory cells such as memory cell 716 remain unselected. Likewise, a negative level (−Vp) of word line 708 will select memory cells such as memory cell 716 while memory cells such as memory cell 714 remain unselected.

The selected memory cells transfer stored data signals to their respective signal bit lines. These data signals are then amplified by their respective sense amplifiers as will be explained in detail. For example, when word line 708 selects memory cell 714, a stored data signal is transferred to signal bit line 710. Reference bit line 712 is charged to a voltage that is between voltages produced on the signal bit line by a stored one and stored zero. For either data state, therefore, sense amplifier 700 receives a difference voltage between signal bit line 710 and reference bit line 712. Sense amplifiers 704 remain inactive during this read operation. Bit lines 706 remain at a stable precharge voltage so that no array noise is coupled to signal bit line 710 or to reference bit line 712 by adjacent bit lines 706. This advantageously provides a maximum difference voltage to sense amplifier 700 during the read operation. Moreover, sense amplifier 700 is not influenced by the data state of nearby active sense amplifiers during the read operation. Bit lines at the ends of the memory array are preferably separated by isolation lines 720 and 722. These isolation lines may be grounded, held at the precharge voltage, or any available and stable voltage.

Figure 14:
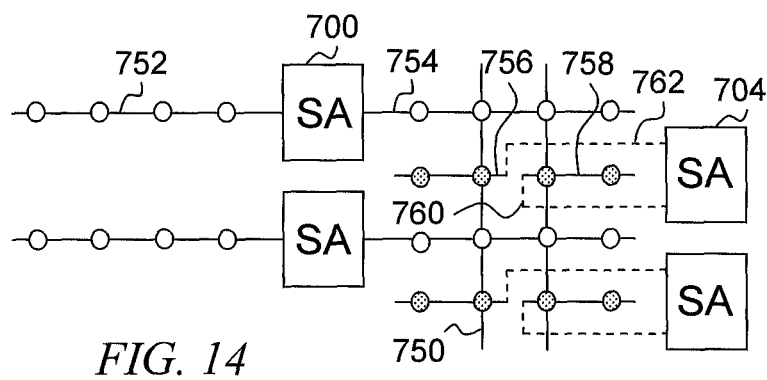
FIG. 14 is a schematic diagram of a subarray comprising an open bit line architecture merged with a folded bit line architecture.

In an alternative embodiment of the present invention, isolation lines 722 may be omitted and the end subarrays of a memory array may be terminated as shown at FIG. 14. A left bank of sense amplifiers, such as sense amplifier 700, is formed with an open bit line architecture. A first bit line 754 is connected to sense amplifier 700 and extends to the right. A second and complementary bit line 752 is connected to sense amplifier 700 and extends parallel to the first bit line and to the left. A right bank of sense amplifiers, such as sense amplifier 704, is formed with a folded bit line architecture as described in U.S. Pat. No. 5,034,920, issued Jul. 23, 1991, and incorporated by reference herein in its entirety. A third bit line 756, connected to sense amplifier 704 via lead 762, extends to the left, adjacent and parallel to bit line 754. A fourth and complementary bit line 758, connected to sense amplifier 704 via lead 760, extends to the right, adjacent and parallel to the first bit line. This embodiment of the present invention advantageously doubles the number of memory cells in the end subarrays. Moreover, the signal-to-noise ratio at the end sense amplifiers is substantially better than for memory cells in the center of the memory array, since the bit line capacitance of each of bit lines 756 and 758 is approximately half of the bit line capacitance of bit line 754. The improved signal-to-noise ratio and reduced bit line capacitance permits the use of substantially smaller end sense amplifiers 704.

Figure 15:
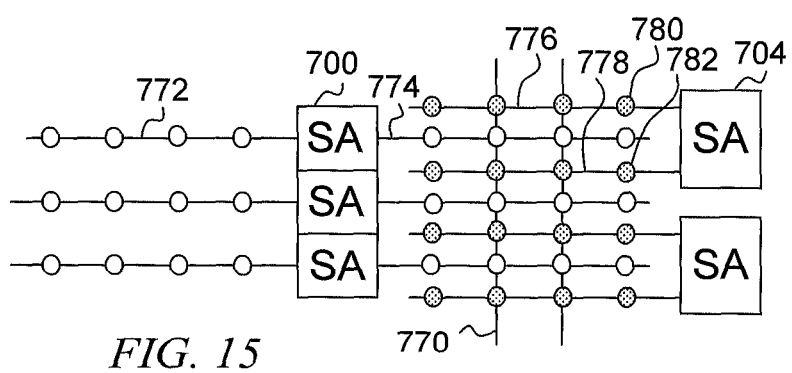
FIG. 15 is a schematic diagram of a subarray comprising an open bit line architecture having one-transistor, one-capacitor (1T-1C) memory cells merged with a folded bit line architecture having two-transistor, two-capacitor (2T-2C) memory cells.

In another embodiment of the present invention, isolation lines 722 may be omitted and the end subarrays of a memory array may be terminated as shown at FIG. 15. A left bank of sense amplifiers, such as sense amplifier 700, is formed with an open bit line architecture. A first bit line 774 is connected to sense amplifier 700 and extends to the right. A second and complementary bit line 772 is connected to sense amplifier 700 and extends parallel to the first bit line and to the left. A right bank of sense amplifiers, such as sense amplifier 704, is formed with a folded bit line architecture having two-transistor, two-capacitor (2T-2C) memory cells. Here, one transistor and one capacitor of the 2T-2C memory cell are illustrated by the circle 780. The other transistor and capacitor of the 2T-2C memory cell is illustrated by the circle 782. A third bit line 776 connected to sense amplifier 704 extends to the left, adjacent and parallel to bit line 774. A fourth and complementary bit line 778 connected to sense amplifier 704 extends to the left, adjacent and parallel to the first bit line. This embodiment of the present invention advantageously increases the number of memory cells in the end subarrays by approximately 50%. Moreover, the signal-to-noise ratio at the end sense amplifiers is substantially better than for memory cells in the center of the memory array, since one half of the 2T-2C memory cell will store +/−Va. This approximately doubles a difference voltage available for sensing at the end sense amplifiers 704. The resulting improved signal-to-noise ratio permits the use of substantially smaller end sense amplifiers 704.

Figure 7B:
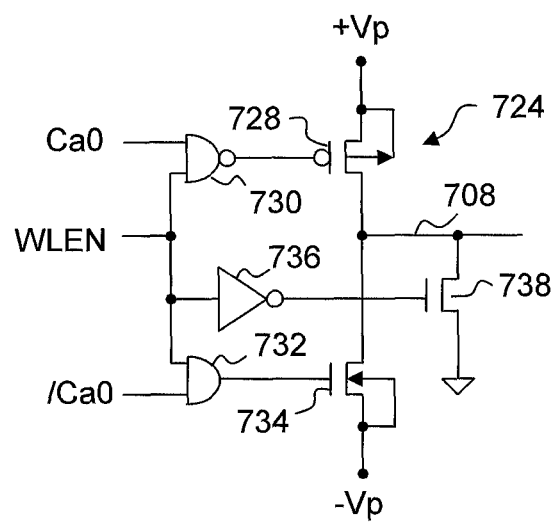
FIG. 7B is a schematic diagram of a word line drive circuit that may be used with the memory array of FIG. 7A.

Turning now to FIG. 7B, there is a schematic diagram of a word line drive circuit that may be used with the memory array of FIG. 7A. In a preferred embodiment of the present invention, control signals and logic gates of the word line drive circuit operate between positive (+Vp) and negative (−Vp) voltage supplies. The circuit includes p-channel drive transistor 728 having a current path connected between positive voltage supply +Vp and word line 708. The circuit further includes n-channel drive transistor 734 having a current path connected between negative voltage supply −Vp and word line 708. When word line enable signal WLEN is low, inverter 736 applies a high level signal to n-channel transistor 738. This turns on n-channel transistor 738 and holds word line 708 at ground or Vss. Word line 708 is selected when word line enable signal WLEN goes high. Least significant column address signal Ca0 goes high to select memory cells of even numbered columns. Alternatively, least significant complementary column address signal /Ca0 goes high to select memory cells of odd numbered columns. For example, when WLEN and Ca0 are both high, NAND gate 730 produces a low output signal to turn on p-channel drive transistor 728 and drive word line 708 to +Vp. A corresponding low level of /Ca0 produces a low output from AND gate 732 so that n-channel drive transistor 734 remains off. When WLEN and /Ca0 are both high, AND gate 732 produces a high output signal to turn on n-channel drive transistor 734 and drive word line 708 to −Vp. A corresponding low level of Ca0 produces a high output from NAND gate 730 so that p-channel drive transistor 728 remains off.

Figure 8A:
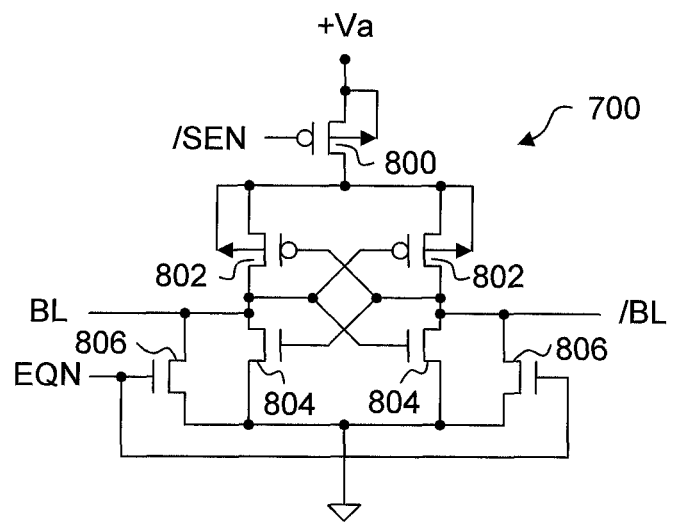
FIG. 8A is a schematic diagram of sense amplifier 700 of FIG. 7A.
Figure 8B:
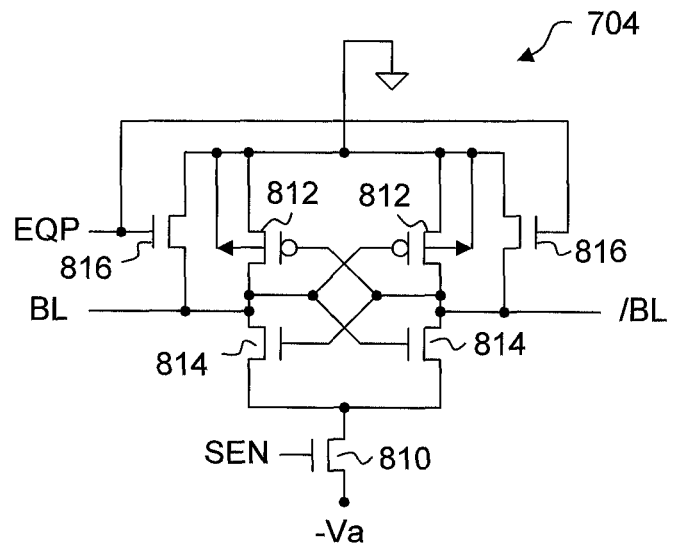
FIG. 8B is a schematic diagram of sense amplifier 704 of FIG. 7A.
Figure 13:
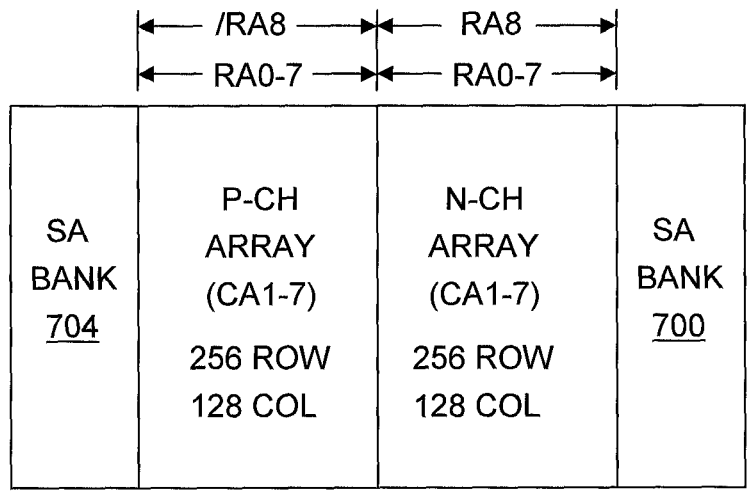
FIG. 13 is a memory map of a virtual subarray when physical column address Ca0 is converted to row address RA8 in the circuit of FIG. 7B.

In order to maintain compatibility with multiplexed row and column addresses according to current dynamic random access memory architecture, a preferred embodiment of the present invention uses physical column address Ca0 as a most significant row address RA8 of a subarray. For example, the subarray of FIG. 13 may include 256 physical rows or word lines and 256 physical columns or bit lines. When physical column address Ca0 is used as most significant row address RA8, the virtual memory map of the subarray is shown at FIG. 13. The subarray is bounded by sense amplifier bank 700 on the right and sense amplifier bank 704 on the left, having sense amplifiers as shown at FIGS. 8A and 8B, respectively. One of 256 rows (word lines) in the subarray is selected by row address signals RA0 through RA7. One of 128 columns (bit lines) in the subarray is selected by column address signals CA1 through CA7. The most significant virtual row address signal RA8, which is the physical column address Ca0, determines whether the selected word line goes positive or negative as previously described with regard to FIG. 7B. When the selected word line goes positive, the right half of the subarray having n-channel pass gate transistors is selected. Alternatively, when the selected word line goes negative, the left half of the subarray having p-channel pass gate transistors is selected.

Figure 7C:
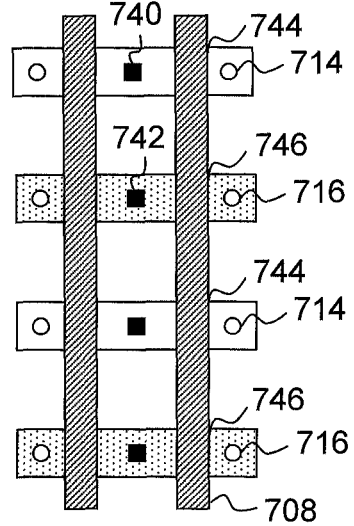
FIG. 7C is a plan view of the memory cells of the memory array of FIG. 7A.

Turning now to FIG. 7C, there is a plan view of memory cells of the memory array of FIG. 7A. Vertical stripes such as vertical stripe 708 are word lines. Horizontal stripes without infill are N+ regions. Horizontal stripes with dotted infill are P+ regions. Small squares with black infill are bit line contacts. Here, bit lines are omitted for clarity. Small circles without infill represent storage capacitors of individual memory cells. These storage capacitors may be formed as capacitors over bit lines (COB), capacitors under bit lines (CUB), or trench capacitors as is well known to those of ordinary skill in the art. Details are omitted for clarity. Storage capacitor 714 is selectively connected to bit line contact 740 by n-channel transistor 744. Likewise, storage capacitor 716 is selectively connected to bit line contact 742 by p-channel transistor 746. Thus, a positive voltage (+Vp) on word line 708 will turn on n-channel transistors 744 while p-channel transistors 746 remain off. A negative voltage (−Vp) on word line 708 will turn on p-channel transistors 746 while n-channel transistors 744 remain off. A ground or Vss level on word line 708 will turn off all transistors 744 and 746 for any stored data state. In a preferred embodiment of the present invention the memory cells of FIG. 7C are separated by shallow trench isolation (STI) and formed on a p-type substrate which serves as a bulk terminal for n-channel transistors 744. A shallow n-well is preferably implanted beneath the P+ regions to form a floating bulk terminal for p-channel transistors 746. Such transistors with floating bulk terminals have been extensively studied with regard to silicon-on-sapphire (SOS) and silicon-on-insulator (SOI) processes. In this manner, one half of the memory cells in a row are selected for a positive (+Vp) word line level and the other half of the memory cells in the row are selected for a negative (−Vp) word line level.

Figure 16:
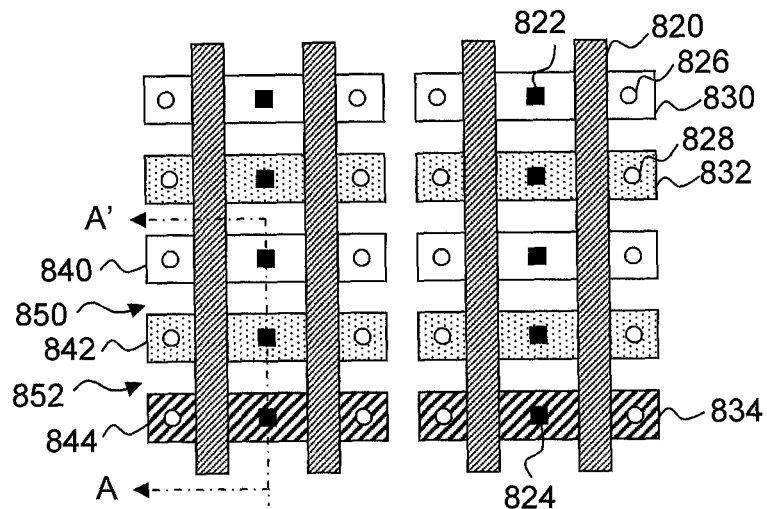
FIG. 16 is a plan view of a partial subarray having shallow trench isolation with a buried guard band.

Turning now to FIG. 16, there is a plan view of another embodiment of a partial subarray having shallow trench isolation with a buried guard band. The partial subarray includes four word lines such as word line 820. Active areas 830 with no infill are preferably N+ and active areas 832 with dotted infill are preferably P+. Here and in the following discussion, active areas are areas of a semiconductor in which transistors may be formed and in which the N+ and P+ areas may serve as source or drain regions. Every intersection of a word line with an N+ active area forms an n-channel pass gate transistor. Likewise, every intersection of a word line with a P+ active area forms a p-channel pass gate transistor. As previously described with regard to FIG. 7C, small circles without infill represent storage capacitors of individual memory cells. These storage capacitors may be formed as capacitors over bit lines (COB), capacitors under bit lines (CUB), or trench capacitors as is well known to those of ordinary skill in the art. Details are omitted for clarity. Each pass gate transistor and adjacent capacitor preferably form a one-transistor, one-capacitor (1T-1C) memory cell unless specified otherwise. Small squares with solid infill such as 822 are bit line contacts. Active areas 834 and 844 are preferably N+ active areas that terminate the edge of the memory array and do not form memory cells. Small squares with dark infill in active areas 834 and 844 are preferably connected to array supply voltage +Va.

Figure 17A:
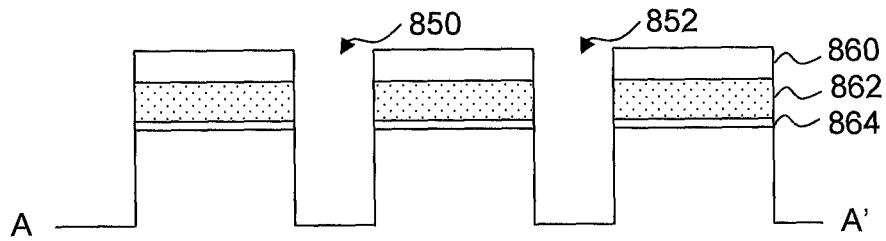
FIGS. 17A through 17C are a cross sectional views showing fabrication of the partial subarray of FIG. 16 as viewed along the plane A-A'.
Figure 17B:
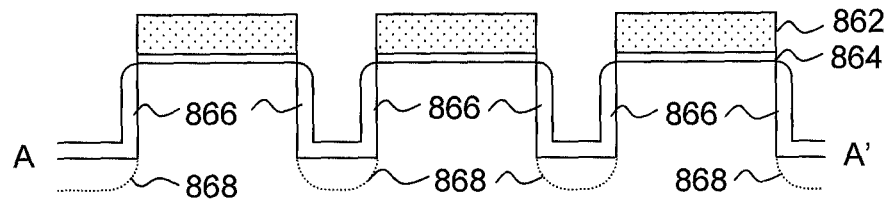
Figure 17C:
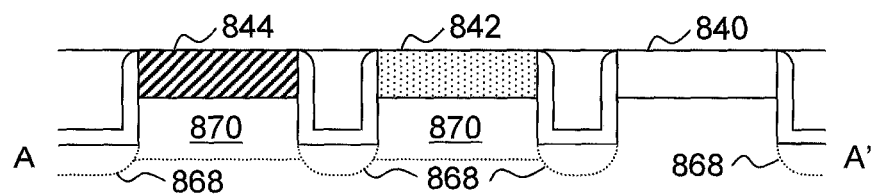

FIGS. 17A through 17C are a cross sectional views showing fabrication of the partial subarray with buried guard band of FIG. 16 viewed along the plane A-A'. The partial subarray is preferably formed at a face of a p-type substrate as shown at FIG. 17A. A thin oxide region 864 is grown at the face of the p-type substrate and a layer of silicon nitride 862 is formed over the oxide layer. A photoresist layer 860 is formed and patterned over the silicon nitride layer 862. Trench regions 850 and 852 are formed by anisotropic etching to a depth greater than the active area junction depth and slightly less than an n-well junction depth as will be described in detail. At FIG. 17B, the photoresist layer 860 is removed, and a thin oxide layer 866 is thermally grown on the side walls and at the bottom of the trenches. An N+ implant of preferably Arsenic (As) or Phosphorus (P) is performed to produce n-type buried guard band regions 868 at the bottom of each trench. At FIG. 17C, an oxide film is deposited by chemical vapor deposition. The silicon nitride region 862 and oxide region 864 are removed and the oxide film is planarized by chemical mechanical polishing (CMP). N-well regions 870 are patterned and implanted under P+ active region 842 and N+ active region 844 to a sufficient depth to electrically contact buried guard band 868. A gate oxide (not shown) is subsequently grown over the active areas. Word lines are patterned and etched and N+ active areas 840 and 844 are implanted to form n-channel pass gates. Likewise, P+ active area 842 is implanted to form p-channel pass gates.

The buried guard band of FIGS. 16 and 17A-17C is highly advantageous for several reasons. First, it forms a buried N+ guard band at the bottom of each isolation trench throughout the memory array. Therefore, it requires no additional layout area within the memory array. Second, the buried N+ guard band is preferably coupled to positive array supply voltage +Va at the edges of the array by N+ active areas 834 and 844 and respective supply lead contacts such as 824. Thus, the positive potential forms a bulk terminal for each p-channel pass gate and requires no additional layout area within the memory cells for surface contacts. Third, the buried N+ guard band 868 and n-well 870 form an excellent minority carrier collector for free electrons in the p-type substrate. Fourth, the grid of buried N+ guard bands 868 within the memory array is formed around and below every active area in the memory array and, therefore, has a very low resistance even at the center of the memory array. Finally, the buried N+ guard bands 868 are compatible with existing complementary metal oxide semiconductor (CMOS) and shallow trench isolation (STI) processes with minor modifications. Thus, they may be advantageously used for peripheral circuits such as row and column decode circuits, sense amplifiers, and peripheral logic gates without the use of conventional N+ guard rings.

Referring now to FIG. 8A, there is a sense amplifier circuit 700 that may be used in the memory array of FIG. 7A. Sense amplifier 700 is connected between a bit line (BL) and a complementary bit line (/BL) and operates between ground or Vss and positive array supply voltage +Va. Array supply voltage +Va has a magnitude approximately an n-channel threshold voltage less than supply voltage +Vp. The sense amplifier includes a cross-coupled latch formed by p-channel transistors 802 and n-channel transistors 804. Here and in the following discussion it should be noted that n-channel transistors 806 and equalization signal EQN need not be included in the sense amplifier and may be centralized in the control circuit of FIG. 9 as will be discussed in detail. Equalization signal EQN remains high when sense amplifier 700 is inactive or unselected. This high level of EQN turns on n-channel transistors 806 and holds BL and /BL to ground or Vss. This low level precharge advantageously affords the full array supply voltage +Va less a bit line reference voltage for p-channel sensing. By way of contrast, an intermediate level precharge voltage near a p-channel transistor threshold voltage would greatly reduce sensing speed and might produce read errors. During a read operation, equalization signal EQN goes low and word line 708 (FIG. 7A) goes high to activate a memory cell 714 and produce a difference voltage between BL and /BL. Sense signal /SEN goes low to turn on p-channel transistor 800 and drive the common source terminal of transistors 802 to +Va. This amplifies the difference voltage on BL and /BL until one of n-channel transistors 804 turns on. This further amplifies the difference voltage until one of the bit lines is driven to +Va and the other is driven to ground or Vss, thereby restoring the voltage level of the memory cell 714. After the voltage level of memory cell 714 is restored, word line 708 returns to ground or Vss and equalization signal EQN returns high to restore the precharge level of sense amplifier 700.

Referring next to FIG. 8B, there is a sense amplifier circuit 704 that may be used in the memory array of FIG. 7A. Sense amplifier 704 is connected between a bit line (BL) and a complementary bit line (/BL) and operates between ground or Vss and negative array supply voltage −Va. Array supply voltage −Va has a magnitude approximately a p-channel threshold voltage less than supply voltage −Vp. The sense amplifier includes a cross-coupled latch formed by p-channel transistors 812 and n-channel transistors 814. Here and in the following discussion it should be noted that n-channel transistors 816 and equalization signal EQP need not be included in the sense amplifier and may be centralized in the control circuit of FIG. 9 as will be discussed in detail. Equalization signal EQP remains high when sense amplifier 704 is inactive or unselected. This high level of EQP turns on n-channel transistors 816 and holds BL and /BL to ground or Vss. This low level precharge advantageously affords the full array supply voltage −Va less a bit line reference voltage for n-channel sensing. By way of contrast, an intermediate level precharge voltage near an n-channel transistor threshold voltage would greatly reduce sensing speed and might produce read errors. During a read operation, equalization signal EQP and word line 708 (FIG. 7A) go low to activate a memory cell 716 and produce a difference voltage between BL and /BL. Sense signal SEN goes high to turn on n-channel transistor 810 and drive the common source terminal of transistors 814 to −Va. This amplifies the difference voltage between BL and /BL until one of p-channel transistors 812 turns on. This further amplifies the difference voltage until one of the bit lines is driven to −Va and the other is driven to ground or Vss, thereby restoring the voltage level of the memory cell 716. After the voltage level of memory cell 716 is restored, word line 708 returns to ground or Vss and equalization signal EQP returns high to restore the precharge level of sense amplifier 704.

Figure 9:
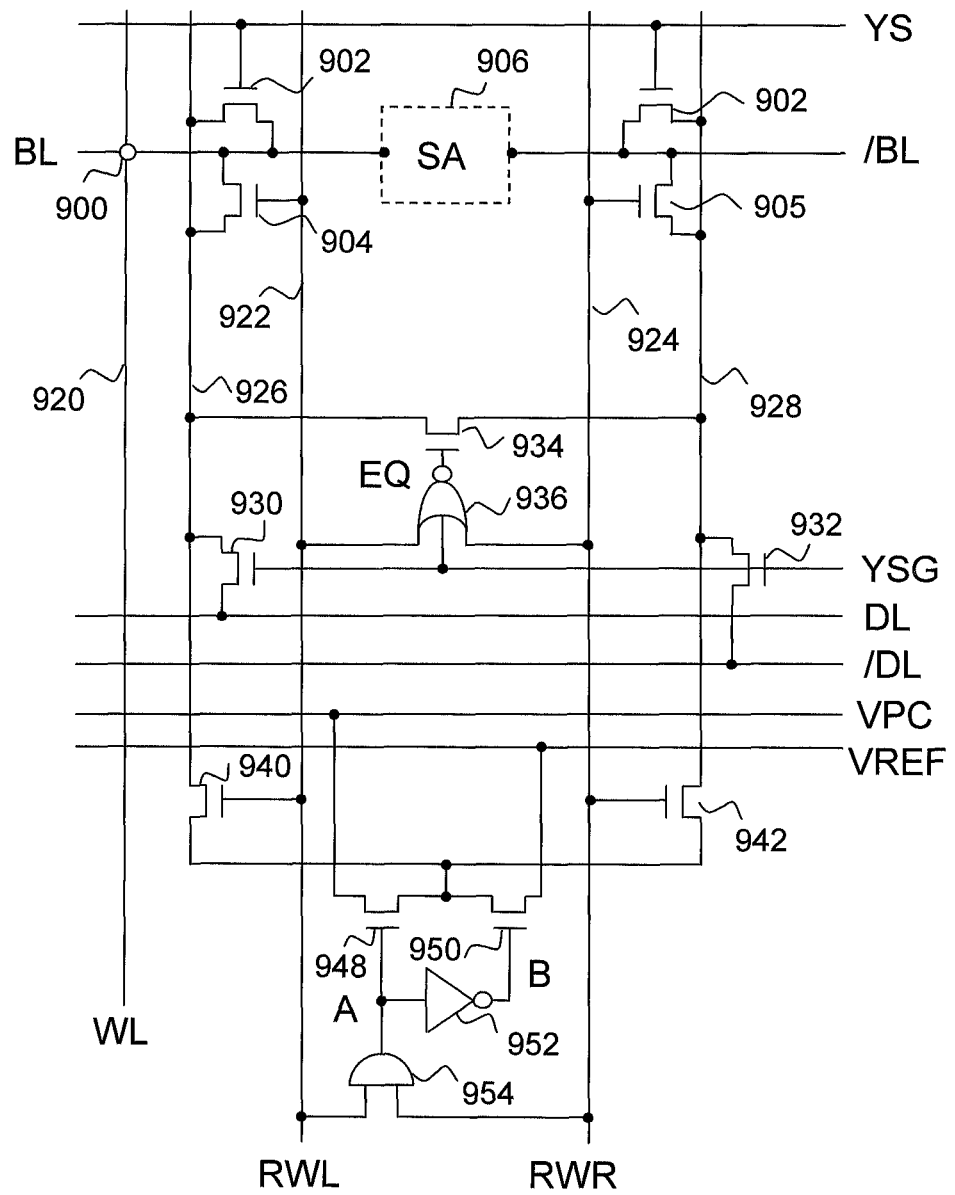
FIG. 9 is a circuit diagram of a sense amplifier and control circuit of the present invention that may be used with the memory array of FIG. 7A.
Figure 10:
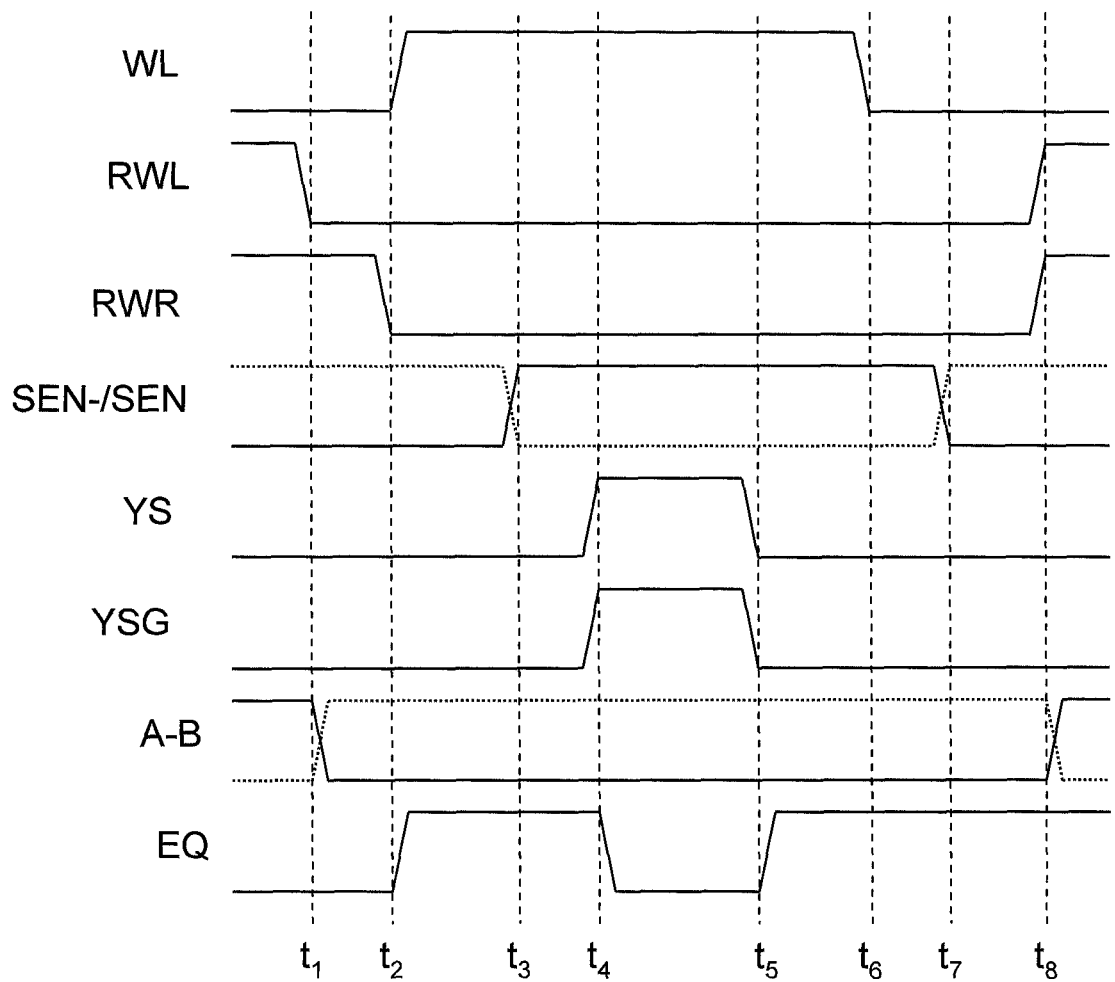
FIG. 10 is a timing diagram showing operation of the circuit of FIG. 9.

Turning now to FIG. 9, there is a sense amplifier and control circuit of the present invention that may be used with the memory array of FIG. 7A. The sense amplifier circuit 906 may be either sense amplifier 700 (FIG. 8A) or sense amplifier 704 (FIG. 8B) as previously described. Sense amplifier circuit 906 is preferably repeated to form a bank of sense amplifiers with corresponding column select (YS) lines. The control circuit includes an equalization circuit having NOR gate 936 and n-channel transistor 934. The control circuit further includes a bias circuit formed by AND gate 954, inverter 952, and n-channel transistors 948 and 950. Operation of the sense amplifier and control circuit will now be described in detail with reference to the timing diagram of FIG. 10.

Prior to a read or write operation, the sense amplifier and control circuit of FIG. 9 is in a precharge state. In this precharge state, word line (WL) 920, column select signal YS, and global column select signal YSG are low. Thus, transistors 902, 930, and 932 are off. Reference word line left (RWL) 922 and reference word line right (RWR) 924 are both high, so n-channel transistors 904, 905, 940, and 942 are on. AND gate 954, therefore, produces a high output at node A to turn on transistor 948. Inverter 952 produces a low output at node B to turn transistor 950 off. Precharge voltage VPC is applied to bit line BL through transistors 948, 940, and 904. Precharge voltage VPC is also applied to complementary bit line /BL through transistors 948, 942, and 905. As previously discussed, VPC is preferably equal to ground or Vss. NOR gate 936 produces a low output (EQ), so transistor 934 is off. Here and in the following discussion, EQ is comparable to either EQN or EQP as previously discussed with regard to FIGS. 8A and 8B.

At time $t_1$ (FIGS. 9-10), RWL goes low, thereby producing a low level at node A and a high level at node B. The low level of RWL also turns off transistors 904 and 940 and leaves BL floating at VPC. The high level of node B applies VREF to /BL through transistors 950, 942, and 905. At time $t_2$ when /BL has settled at VREF, RWR goes low, thereby turning off transistors 905 and 942 so that /BL is floating. Next WL 920 goes high to activate memory cell 900 and produce a data signal on BL. The low level of RWR, RWL, and YSG produces a high level EQ to turn on transistor 934 and equalize lines 926 and 928. At time $t_3$, when a difference voltage is fully developed between BL and /BL, sense amplifier 906 is activated and the difference voltage is amplified as previously described. At time $t_4$ when the difference voltage is sufficiently amplified, YS goes high to couple BL to line 926 and /BL to line 928. YSG also goes high to turn off n-channel transistor 934, turn on transistors 930 and 932, and apply the amplified difference voltage on lines 926 and 928 to data line DL and complementary data line /DL, respectively. At time $t_5$, after the data signal on DL and /DL is latched, YS and YSG go low. At time $t_6$, after the data signal in memory cell 900 is fully restored, WL goes low to store the data signal in memory cell 900. At time t7, sense amplifier 906 is inactivated and returned to a precharge state. Finally, at time t8, RWL and RWR go high to restore the control circuit, BL, and /BL to the precharge state.

The present invention advantageously provides a low noise memory array as previously described with respect to FIG. 7A. Furthermore, the sense amplifier and control circuits of FIG. 9 provide a simple and smaller design than those of the prior art. Since the bit lines are always connected to their respective sense amplifier, there is no need for additional switching circuitry as when a sense amplifier must be shared with left and right memory arrays. Moreover, equalization, precharge, and reference voltage control are preferably centralized in the control circuit need not be distributed throughout the sense amplifier bank. For example, lines 926 and 928 apply the precharge voltage (VPC) to bit lines prior to time $t_1$ and after time $t_8$. Between time $t_1$ and $t_2$, line 926 floats and line 928 applies reference voltage VREF to /BL. Finally, at time $t_4$, lines 926 and 928 couple BL and /BL to DL and /DL, respectively.

Figure 12:
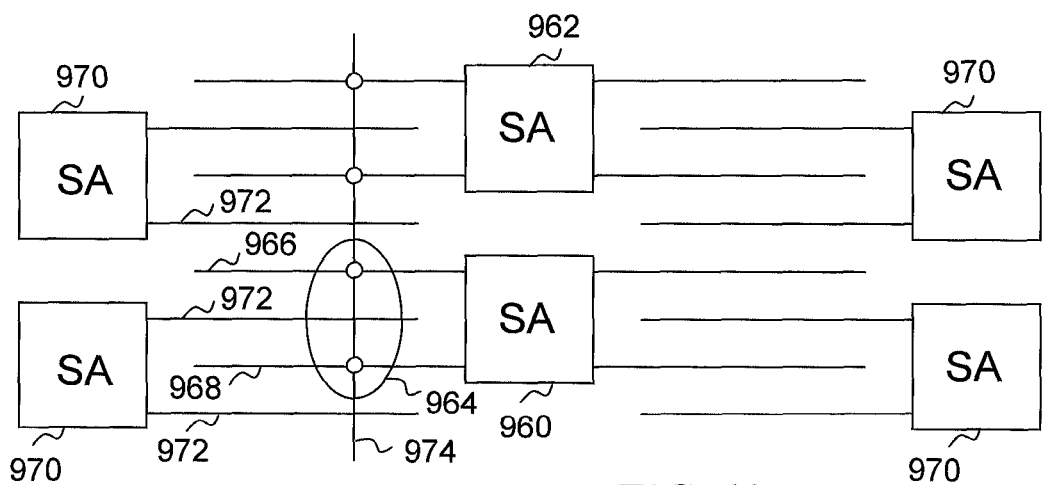
FIG. 12 is a diagram of another embodiment of a memory array of the present invention that may be used with static random access memory cells.

Turning now to FIG. 12, there is a diagram of another embodiment of a memory array of the present invention that may be used for static random access memories or 2-transistor and 2-capacitor memory cells. The memory array includes sense amplifiers 960, 962, and 970. Each sense amplifier includes a respective pair of bit lines. Each bit line includes a plurality of memory cells such as memory cell 964. A word line, such as word line 974, selects a row of memory cells during a read operation. The selected memory cells, such as memory cell 964, transfer stored data signals to their respective signal bit lines. These data signals are then amplified by their respective sense amplifiers. For example, when word line 974 selects memory cell 964, a stored data signal is transferred to complementary signal bit lines 966 and 968. For either data state, therefore, sense amplifier 960 receives a difference voltage between signal bit lines 966 and 968. Sense amplifiers 970 remain inactive during this read operation. Bit lines 972 remain at a stable precharge voltage so that no array noise is coupled to signal bit lines 966 or 968 by adjacent bit lines 972. This advantageously provides a maximum difference voltage to sense amplifier 960 during the read operation. Moreover, sense amplifier 960 is not influenced by the data state of nearby active sense amplifiers such as sense amplifier 962 during the read operation. As previously discussed, bit lines at the ends of the memory array are preferably separated by isolation lines, which may be grounded, held at the precharge voltage, or any available and stable voltage.

Figure 11:
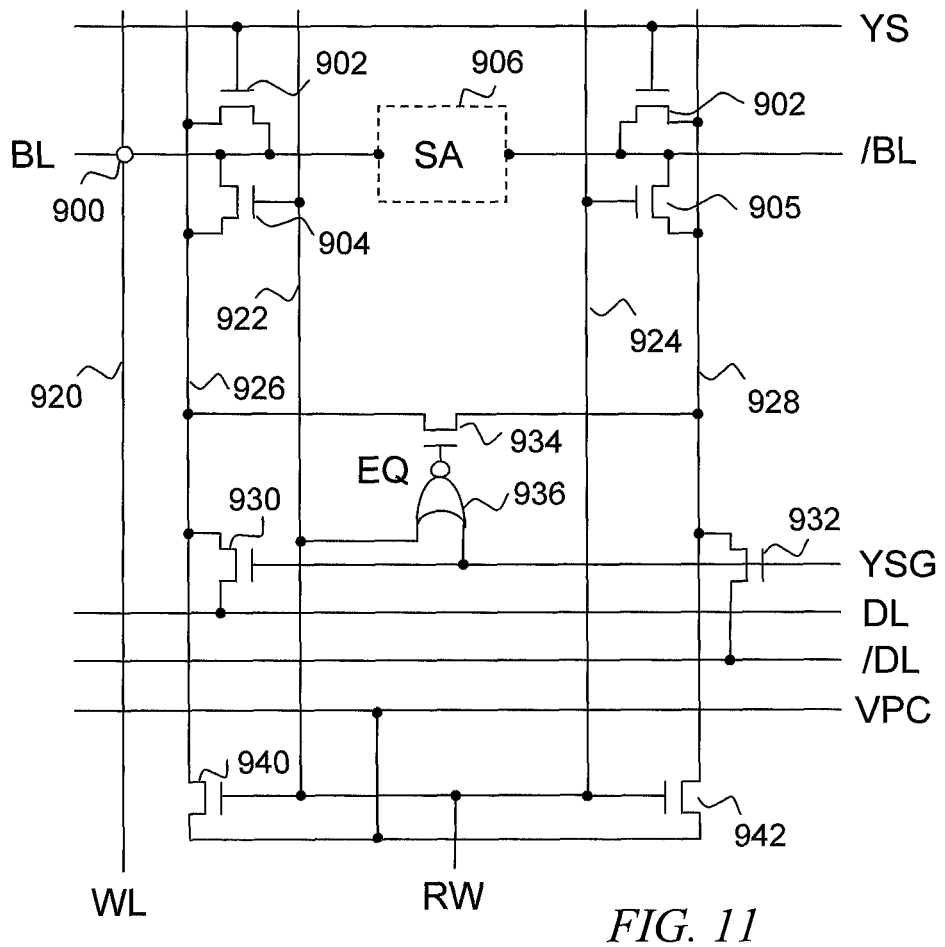
FIG. 11 is a circuit diagram of a sense amplifier and control circuit as in FIG. 7A when a precharge voltage (VPC) is equal to a reference voltage (VREF)

Still further, while numerous examples have thus been provided, one skilled in the art should recognize that various modifications, substitutions, or alterations may be made to the described embodiments while still falling within the inventive scope as defined by the following claims. For example, FIG. 11 is an alternative embodiment of the present invention where VPC is the same as VREF. This is a simplified version of the circuit of FIG. 9 where the common terminal of transistors 940 and 942 may be directly connected to the VPC supply voltage. Thus, transistors 948 and 950, AND gate 954, and inverter 952 may be eliminated. Also, only a single reference word line (RW) is required and operates similar to the previously described RWL. Embodiments of the present invention may be applied to virtually any memory array having complementary bit lines. For example, the present invention may also be applied to a memory array having an open architecture without a cross point configuration. In this case, memory cells are arranged as they would be with a folded architecture and all memory cell access transistors have the same conductivity type. Other combinations will be readily apparent to one of ordinary skill in the art having access to the instant specification.

What is claimed is:
1. A memory array, comprising:
a first sense amplifier having a first bit line extending in a first direction and a second bit line extending in a second direction different from the first direction and parallel to the first bit line;
a second sense amplifier having a third bit line adjacent and parallel to the first bit line, wherein the third bit line remains inactive while the first bit line is active;
a plurality of word lines extending in a third direction perpendicular to the first direction and forming cross points with the first and third bit lines; and a plurality of memory cells, each memory cell respectively connected to a word line and a bit line of each cross point.

2. A memory array as in claim 1, wherein the first bit line is active during one of a read, write, and refresh operation, and wherein the third bit line is inactive when it receives one of a precharge voltage and a reference voltage.

3. A memory array as in claim 1, wherein the first and second bit lines are connected to a plurality of one-transistor one-capacitor (1T-1C) memory cells.

4. A memory array as in claim 1, comprising a fourth bit line connected to the second sense amplifier, wherein the first and second bit lines comprise an open bit line architecture, and wherein the third and fourth bit lines comprise a folded bit line architecture.

5. A memory array as in claim 4, wherein the third bit line is connected to a plurality of one-transistor one-capacitor (1T-1C) memory cells.

6. A memory array as in claim 4, wherein the third and fourth bit lines are connected to a plurality of two-transistor two-capacitor (2T-2C) memory cells.

7. A memory array as in claim 1, wherein the furl bit line is connected to a first plurality memory cells, each memory cell of the first plurality having a transistor of a first conductivity type, and wherein the third bit line is connected to a second plurality of memory cells, each memory cell of the second plurality having a transistor of a second conductivity type.

8. A memory array as in claim 1, comprising a fourth bit line connected to the second sense amplifier, wherein each of the third and fourth bit lines is connected to a respective first number of memory cells, and wherein the first bit line is connected to a second number of memory cells.

9. A static random access memory (SRAM) array, comprising:
a first sense amplifier coupled to a first bit line extending in a first direction and a second bit line extending in the first direction;
a first plurality of SRAM cells, each SRAM cell of the first plurality coupled to the first and second bit lines; and
a second sense amplifier coupled to a third bit line adjacent and parallel to the first and second bit lines, wherein the third bit line remains inactive while the first and second bit lines are active.

10. A static random access memory array as in claim 9, comprising:
a fourth bit line coupled to the second sense amplifier and parallel to the first and second bit lines; and
a second plurality of SRAM cells, each SRAM cell of the second plurality coupled to the third and fourth bit lines.

11. A static random access memory array as in claim 9, comprising:
a fifth bit line extending from the first sense amplifier in a second direction;
a sixth bit line extending from the first sense amplifier in the second direction; and
a third plurality of SRAM cells, each SRAM cell of the third plurality coupled to the fifth and sixth bit lines.

12. A static random access memory array as in claim 11, comprising:
a third sense amplifier coupled to a seventh bit line adjacent and parallel to the fifth and sixth bit lines, wherein the seventh bit line remains inactive while the fifth and sixth bit lines are active.

13. A memory array, comprising:
a first sense amplifier having a first bit line extending in a first direction and a second bit line extending in a second direction different from the first direction;
a second sense amplifier having a third bit line adjacent and parallel to the first bit line and a fourth bit line adjacent and parallel to the first bit line; and
a plurality of word lines extending in a third direction perpendicular to the first direction and forming cross points with the first and third bit lines, wherein a respective memory cell is connected to a word line and a bit line of each cross point.

14. A memory array as in claim 13, wherein the first bit line is active during one of a read, write, and refresh operation, and wherein the third and fourth bit lines are inactive when they receive one of a precharge voltage and a reference voltage.

15. A memory array as in claim 13, wherein the third and fourth bit lines are connected to a plurality of one-transistor one-capacitor (1T-1C) memory cells.

16. A memory array as in claim 13, wherein the third and fourth bit lines are connected to a plurality of two-transistor two-capacitor (2T-2C) memory cells.

17. A memory array as in claim 13, wherein the first bit line is connected to a first plurality memory cells, each memory cell of the first plurality having a transistor of a first conductivity type, and wherein the third bit line is connected to a second plurality of memory cells, each memory cell of the second plurality having a transistor of a second conductivity type.

18. A memory array as in claim 13, comprising a word line connected to a row of memory cells, wherein a memory cell is formed at every cross point of the word line and the first bit line and at every cross point of the word line and the third bit line.

19. A memory array as in claim 13, wherein a number of memory cells connected to the first bit line is different from a number of memory cells connected to the third bit line.

20. A memory array as in claim 13, wherein the plurality of word lines form cross points with the fourth bit line, and wherein a respective memory cell is connected to a word line and a bit line of each cross point.

* * * * *